United States Patent [19]

Fang

[11] Patent Number: 4,639,543

[45] Date of Patent: Jan. 27, 1987

[54] SEMICONDUCTOR DEVICES HAVING A METALLIC GLASS SUBSTRATE

[75] Inventor: Pao-Hsien Fang, Belmont, Mass.

[73] Assignee: Richard J. Birch, Wellesley, Mass.; a part interest

[21] Appl. No.: 709,572

[22] Filed: Mar. 8, 1985

Related U.S. Application Data

[63] Continuation-in-part of Ser. No. 698,073, Feb. 4, 1985, abandoned.

[51] Int. Cl.[4] .............................................. H01L 31/04
[52] U.S. Cl. .................................. 136/256; 136/258; 357/30; 357/65; 428/620
[58] Field of Search ......... 136/256, 258 PC, 258 AM; 357/2, 30, 65; 428/620

[56] References Cited

U.S. PATENT DOCUMENTS 3,914,856  10/1975  Fang ........................................ 29/572
4,229,231  10/1980  Witt et al. ............................. 148/1.5

FOREIGN PATENT DOCUMENTS 56-94677  7/1981  Japan ............................ 136/258 AM
57-13777  1/1982  Japan ............................ 136/258 AM

*Primary Examiner*—Aaron Weisstuch
*Attorney, Agent, or Firm*—Richard J. Birch

[57] ABSTRACT

For electronic devices such as solar cells, the substrate is an integral part of the device. The present invention employs metallic glass as the substrate for semiconductor devices. The metallic glass substrate is both morphologically amorphous and electrically conductive. The use of such a substrate permits a morphologically amorphous semiconductor material to be deposited on a morphologically amorphous and electrically conductive substrate. The metallic glass substrate can also be used in other forms of semiconductor devices whose morphological nature does not affect the device processing and the device performance. Thus, either morphologically amorphous or crystalline semiconductor materials can be deposited on the metallic glass substrate to form electronic devices.

14 Claims, No Drawings

SEMICONDUCTOR DEVICES HAVING A METALLIC GLASS SUBSTRATE

CROSS-REFERENCE TO RELATED APPLICATION

This application is a continuation-in-part application of Ser. No. 698,073 filed Feb. 4, 1985 for "Metallic Glass Substrate For Thin Film Electronic Devices", now abandoned.

BACKGROUND OF THE INVENTION

In thin film electronic devices fabrication, the process comprises depositing different layers of materials on a substrate. For example, in conventional amorphous silicon solar cells on silicate glass substrates, the layers comprise (1), a conductive layer, either metallic and therefore opaque, or transparent and conductive, such as of indium tin oxide, (2) a p-type amorphous silicon layer, (3) an intrinsic amorphous silicon layer and (4) an n-type amorphous silicon layer. A major disadvantage of the glass substrate is that it is not only fragile, but also for a large area device an additional protective frame has to be employed with a concomitant increase in the cost of the device. Furthermore, since the glass itself is not conductive, a layer such as (1) described above is necessary. This conductive layer is usually a crystalline form and therefore, not amorphous. The growth of amorphous material on a non-amorphous substrate leads to a phase instability and therefore, is not desirable.

A metallic substrate, such as steel, is often used as a replacement for the glass substrate. In this case, steel directly, or steel with a passivation metal layer such as aluminum, titanium or tungsten can be used as an electrode. Since steel and metal coated steel have a crystallite structure they will have many grains and grain boundaries. Along the boundaries, sharp spikes and cavities exist. A non-uniform thickness or disrupted surface is formed when the size of these local irregularities is the same order of magnitude as the thickness of the film. This type of surface deteriorates the device performance. Processes to polish away the spikes or the cavities are very laborious and costly and, therefore, not practical. Metallic glass eliminates the problems associated with metal substrates and avoids the necessity of a separate conductive layer in the case of glass substrates. Metallic glass' electrical conductivity and amorphous morphology permit the direct deposition of an amorphous semiconductor material thereon.

In some film devices, which as gallium arsenide and related III-V compound semiconductors, cadmium sulfide and related II-VI compound semiconductors, or germanium and selenium elementary semiconductors, crystallization can be achieved at a low temperature and is independent of the morphological nature of the substrate. In this case, metallic glass also can be used as a substrate.

Metallic glass, because it is readily producible in large quantities on the order of tens of kilometers in the form of a very thin, flexible ribbon, and because of its elastic nature in this ribbon form, provides an ideal substrate for many electronic devices. However, it should be understood that metallic glass in rigid form is also useful as a substrate for semiconductor devices.

DETAILED DESCRIPTION OF THE INVENTION

A material which maintains the amorphous nature of glass, but is electrically conductive, is one of a class of materials called "metallic glass". The technology of metallic glass is described in the paper of Davis, DeCristofaro and Smith entitled "Technology of Metallic Glasses" presented at the Conference on Metallic Glasses: Science and Technology, Budapest, Hungary, June 30–July 4, 1980. The paper contains an extensive bibliography of papers, articles and patents relating to metallic glasses. For earlier work in the field of metallic glasses see:

(1) W. Klement, R. H. Willens and P. Duwez, *Nature*, 187, 869 (1960)
(2) P. Duwez, *Ann. Rev. Materials Science*, 6, 83 (1976)
(3) P. Duwez and R. H. Willens, *Trans. AIME*, 227, 362 (1963)
(4) *Chem. and Eng. News*, p. 24, 19 Nov. 1973
(5) F. Saepen and D. Turnbull, in "Metallic Glasses" (J. J. Gilman and H. J. Leamy, eds.) ASM, Metals Park, OH, 1978, p. 114

Metallic glass is commonly made by quenching from a liquidus melt of mixed composition, usually a transition metal and a metalloid such as boron, carbon, silicon, or phosphorus. It is interesting to note that silicon, an important solar cell material, has a unique property in that it can form a glassy structure by itself. In contrast, many other elements have to combine with one or more elements to form the glassy state.

One process to make the metallic glass is by an impingement of a liquid jet of the alloy composition on the periphery of a rapidly rotating drum. With this process, a commercial product in the form of ribbons in the length of kilometers and width of many centimeters is available from the Allied Corporation (Parsippany, N.J.) under the trademark "Metglas". The metallic glass can also be made by evaporating successively thin layers of individual metallic glass forming materials as pure constituents and deposited in alternate layers on foreign substrate following the deposition. This multilayer is irradiated by high energy ions to form a glassy structure. (M. Van Rossum, M. A. Nicolet and C. W. Witts, *Journal of Applied Physics*, 56, 1032, 1984). While metallic glass usually has a ribbon form, the ion mixing process allows metallic glass to be produced in a specifically desired form, for example, a solar cell substrate in a configuration to fit a liquid crystal watch or calculator surface.

Concerning the specific types of metallic glass, many elements which have applications in semiconductor devices are contained in different types of metallic glasses. They are first, titanium, molybdenum, palladium, tin, and tungsten, which belong to the category of having a good ohmic property in contacting semiconductor material such as silicon and germanium. Second, silicon in the metallic glass produces a stability effect in the reaction between the substrate and the deposited silicon. Third, boron or phosphorus are the most effective doping elements for silicon and germanium, with boron for p-type autodoping and phosphorus for n-type autodoping from the substrate, as well as providing a stability effect to inhibit impurity migration. On the other hand, when the semiconductor is made of selenium or gallium arsenide, zinc and silicon can be used as an autodoping element and stabilizing agent. Thus the metallic glass substrate, at a suitably elevated temperature can be used as an autodoping source (Pao-Hsien Fang, U.S. Pat. No. 3,194,856) as well as a stabilizer.

Other properties of the metallic glass, especially in the ribbon configuration, that make it useful for substrates are its flexibility, elasticity, and electrical conductivity. In comparison with other flexible substrate materials such as many plastics and polyimide, the metallic glass ribbon is electrically conductive while the plastics and polyimide are not. Moreover, the metallic glass ribbon is stable even at temperatures of 400° C. or above, while the stability of plastics and polyimide is limited to below 100° to 300° C. Of course, ordinary metallic substrates such as steel and molybdenum can be flexible and elastic, but from economic and surface topographical considerations, metallic glass has advantages.

In some electronic device configurations, an insulating layer is placed on top of a metallic substrate, for example, a silicon nitride or oxide layer on steel. After that a pattern of electrical leads is formed, followed by a semiconductor structure that is deposited. In this case, the electrical conductive property of the substrate may or may not be used. The same configuration can be made on a metallic glass substrate.

A particular semiconductor property of the metallic glass is its good ohmic contact with the deposited semiconductor. For example, with a superficial surface etching by aqua regia, I found that the "Metglas", such as MHF157, MHF6M, and MBF20 made by the Allied Company each form good ohmic contact with doped silicon. This ohmicity is found in silicon, either amorphous or crystalline in structure, and deposited by well known processes, such as, a glow discharge or an electron beam evaporation. Therefore, with the present invention, it becomes possible to deposit amorphous or crystalline material directly on an amorphous and electrically conductive substrate, i.e. metallic glass. It will be appreciated that it also is possible to deposit silicon alloys, such as silicon-tin, silicon-germanium, or other silicon-isovalent elements on the amorphous and electrically conductive metallic glass substrate.

There is a wide choice of metallic glass materials. For example, I have found that Allied Company's MHF157, MHF6M, and MBF20 metallic glass all work well as a substrate for thin film silicon solar cells. These materials have chromium and cobalt as main ingredients, can be formed in the air, and, therefore, are economical in production. When greater electrical conductivity is required, for example, the "Metglas" 2000 series with its high copper content can be utilized. On the otherhand, when better electrical contact with the deposited semiconductor material is desired, the "Metglas" 1000 series with its high palladium content would be a choice. There are many other possible compositions that can be used to form metallic glass. The catalog of Allied Company provides a partial list of such compositions. From these various commercially available materials, a choice to fit semiconductor device requirements and economical considerations can be made.

Having described in detail various embodiments of my invention, it will now be apparent to those skilled in the art that numerous modifications can be made to those embodiments without departing from the scope of the invention as defined in the following claims:

What I claim and desire to secure by Letters Patent of the United States is:

1. An amorphous semiconductor device comprising:
   an amorphous and electrically conductive substrate of metallic glass; and,
   at least one amorphous semiconductor layer deposited on said metallic glass substrate.

2. The amorphous semiconductor device of claim 1 wherein said at least one amorphous semiconductor layer is made of silicon or its alloys.

3. The amorphous semiconductor device of claim 2 wherein said metallic glass substrate includes phosphorous or boron as one of its constituents, said phosphorous or boron providing an autodoping source and stabilizer for the deposited, immediately superimposed amorphous semiconductor layer.

4. A crystalline semiconductor device comprising:
   an amorphous and electrically conductive substrate of metallic glass; and,
   at least one crystalline semiconductor layer deposited on said metallic glass substrate, said metallic glass substrate including phosphorous or boron as one of its constituents with said phosphorous or boron providing an autodoping source and stabilizing for the deposited, immediately superimposed crystalline semiconductor layer.

5. The crystalline semiconductor device of claim 4 wherein said at least one crystalline semiconductor layer is made of silicon or its alloys.

6. A solar cell comprising:
   an amorphous and electrically conductive substrate of metallic glass, said substrate forming one electrode of the solar cell;
   at least one amorphous semiconductor layer deposited on said metallic glass substrate; and,
   another electrode in electrically conductive contact with said at least one amorphous semiconductor layer.

7. The solar cell of claim 6 wherein said at least one amorphous semiconductor layer is made of silicon.

8. The solar cell of claim 6 wherein said amorphous semiconductor layer is made of silicon alloyed with its isovalent elements.

9. The solar cell of claims 7 or 8 wherein said metallic glass substrate includes phosphorous or boron as one of its constituents, said phosphorous or boron providing an autodoping souce and stabilizer for the deposited, immediately superimposed amorphous semiconductor layer.

10. A solar cell comprising:
    an amorphous and electrically conductive substrate of metallic glass, said substrate forming one electrode of the solar cell;
    at least one crystalline semiconductor layer deposited on said metallic glass substrate; and,
    another electrode in electrically conductive contact with said at least one crystalline semiconductor layer, said metallic glass substrate including phosphorous or boron as one of its constituents with said phosphorous or boron providing an autodoping souce and stabilizer for the deposited, immediately superimposed crystalline semiconductor layer.

11. The solar cell of claim 10 wherein said at least one crystalline semiconductor layer is made of silicon.

12. The solar cell of claim 10 wherein said crystalline semiconductor layer is made of silicon alloyed with its isovalent elements.

13. A solar cell comprising:

an amorphous and electrically conductive substrate of metallic glass, said substrate forming one electrode of the solar cell;

at least one semiconductor layer deposited on said metallic glass substrate; and, another electrode in electrically conductive contact with said at least one semiconductor layer said metallic glass substrate having one or more constituents of zinc, silicon, and copper, said one or more constituents providing an autodoping source and stabilizer for the deposited, immediately superimposed semiconductor layer.

14. The solar cell of claim 13 wherein said at least one semiconductor layer is made of compound semiconductors chosen from gallium arsenide, cadmium sulfide, and other multi-component compounds.

* * * * *